(12) United States Patent
Gamble, Jr.

(10) Patent No.: US 12,248,741 B2
(45) Date of Patent: Mar. 11, 2025

(54) SYSTEMS AND METHODS FOR DENOISING GPS SIGNALS USING SIMULATED MODELS

(71) Applicant: Verizon Patent and Licensing Inc., Basking Ridge, NJ (US)

(72) Inventor: Jerry Gamble, Jr., Grapevine, TX (US)

(73) Assignee: Verizon Patent and Licensing Inc., Basking Ridge, NJ (US)

(*) Notice: Subject to any disclaimer, the term of this patent is extended or adjusted under 35 U.S.C. 154(b) by 739 days.

(21) Appl. No.: 16/941,076

(22) Filed: Jul. 28, 2020

(65) Prior Publication Data

US 2022/0035972 A1    Feb. 3, 2022

(51) Int. Cl.
*G06F 30/27* (2020.01)
*G01S 19/23* (2010.01)
(Continued)

(52) U.S. Cl.
CPC .............. *G06F 30/27* (2020.01); *G01S 19/23* (2013.01); *G06N 3/02* (2013.01); *G06N 3/044* (2023.01); *G06N 3/0442* (2023.01); *G06N 20/00* (2019.01)

(58) Field of Classification Search
None
See application file for complete search history.

(56) References Cited

U.S. PATENT DOCUMENTS 5,214,757 A * 5/1993 Mauney ................. G06T 17/05
701/532
5,319,374 A * 6/1994 Desai ..................... G04R 20/02
342/357.43
(Continued)

FOREIGN PATENT DOCUMENTS

CN      106772498 A  *  5/2017  ............. G01S 19/42
CN      113495562 A  *  10/2021
WO   WO-2021199175 A1  *  10/2021  ............. G06N 20/00

OTHER PUBLICATIONS

C. Shen et al., "Seamless GPS/Inertial Navigation System Based on Self-Learning Square-Root Cubature Kalman Filter," in IEEE Transactions on Industrial Electronics, vol. 68, No. 1, pp. 499-508, Jan. 2021, doi: 10.1109/TIE.2020.2967671. (Year: 2021).*

(Continued)

*Primary Examiner* — Akash Saxena

(57) ABSTRACT

A device may receive simulation information associated with iteratively simulating movement of a geolocation unit. The device may generate simulated true paths for simulations of the movement of the geolocation unit. The device may configure, based on the simulation information, noise parameters associated with simulating distortion of a signal received by the geolocation unit during the simulations to generate simulated measured paths. The device may execute the simulations to correspondingly generate sets of simulation data, training, using the sets of simulation data, a geolocation correction model based on differences between true location data of the simulated true paths and simulated measured data of the simulated measured paths. The device may configure the geolocation correction model to process a geolocation signal of an active geolocation unit to determine a location of the active geolocation unit based on the differences between the true location data and the simulated measured data.

20 Claims, 8 Drawing Sheets

(51) Int. Cl.
  *G06N 3/02* (2006.01)
  *G06N 3/044* (2023.01)
  *G06N 3/0442* (2023.01)
  *G06N 20/00* (2019.01)

(56) References Cited

U.S. PATENT DOCUMENTS

| | | | | |
|---|---|---|---|---|
| 6,127,970 | A * | 10/2000 | Lin | G01S 19/23 |
| | | | | 342/357.31 |
| 6,778,025 | B1 * | 8/2004 | Leuthold | G06F 30/367 |
| | | | | 716/136 |
| 7,742,620 | B2 * | 6/2010 | Chen | G06V 10/811 |
| | | | | 382/312 |
| 9,025,640 | B2 * | 5/2015 | Haker | G01S 19/22 |
| | | | | 375/147 |
| 9,734,184 | B1 * | 8/2017 | Lagacé | G09B 9/02 |
| 10,440,503 | B2 * | 10/2019 | Tapia | H04W 64/003 |
| 10,989,544 | B2 * | 4/2021 | Haque | G06N 3/045 |
| 11,042,677 | B1 * | 6/2021 | Fu | G06F 30/27 |
| 11,062,034 | B1 * | 7/2021 | Li | G06F 21/54 |
| 11,151,447 | B1 * | 10/2021 | Chen | G01S 7/4091 |
| 11,423,195 | B2 * | 8/2022 | Jengo | G06F 18/25 |
| 2007/0159394 | A1 * | 7/2007 | Grabbe | G01S 5/12 |
| | | | | 342/451 |
| 2010/0309044 | A1 * | 12/2010 | Ische | G01S 19/48 |
| | | | | 342/357.28 |
| 2013/0311554 | A1 * | 11/2013 | Mahajan | H04W 4/70 |
| | | | | 709/204 |
| 2013/0338958 | A1 * | 12/2013 | Shanishchara | G01C 25/00 |
| | | | | 702/116 |
| 2014/0031021 | A1 * | 1/2014 | Simonyi | H04W 24/02 |
| | | | | 455/418 |
| 2016/0021503 | A1 * | 1/2016 | Tapia | H04W 24/02 |
| | | | | 455/456.1 |
| 2017/0061655 | A1 * | 3/2017 | Pylappan | G06T 11/00 |
| 2019/0154842 | A1 * | 5/2019 | Adachi | G01S 19/485 |
| 2019/0204088 | A1 * | 7/2019 | Haque | G06N 3/02 |
| 2019/0353800 | A1 * | 11/2019 | Nirula | G01S 19/22 |
| 2020/0049837 | A1 * | 2/2020 | Werner | G01S 19/40 |
| 2020/0371250 | A1 * | 11/2020 | Filarsky | G06F 30/20 |
| 2021/0110089 | A1 * | 4/2021 | Chen | G06T 7/0004 |
| 2021/0286923 | A1 * | 9/2021 | Kristensen | G01S 7/412 |
| 2021/0334626 | A1 * | 10/2021 | Hang | G06N 3/063 |
| 2021/0387584 | A1 * | 12/2021 | Daniels | G06V 20/58 |
| 2021/0400438 | A1 * | 12/2021 | Tran | G06F 18/256 |
| 2022/0035972 | A1 * | 2/2022 | Gamble, Jr. | G01S 19/393 |
| 2022/0038465 | A1 * | 2/2022 | Pegg | H04L 63/0876 |
| 2022/0057530 | A1 * | 2/2022 | Wang | G01S 19/04 |
| 2022/0198107 | A1 * | 6/2022 | Pedersen | G06F 30/27 |
| 2022/0390964 | A1 * | 12/2022 | Youmans | G05D 1/104 |

OTHER PUBLICATIONS

Lin et al., "Health-based Fault Generative Adversarial Network for Fault Diagnosis in Machine Tools," Association for the Advancement of Artificial Intelligence, 2020, Department of Electrical and Computer Engineering, National Chiao Tung University, Taiwan.

* cited by examiner

SYSTEMS AND METHODS FOR DENOISING GPS SIGNALS USING SIMULATED MODELS

BACKGROUND

Geolocation is the identification of the real-world geographical location of an object, such as a mobile communication unit. A network operator may use geolocation to identify the location of a mobile communication unit connected to a network associated with the network operator and to associate the location of the mobile communication unit with data or events relating to the mobile communication unit.

DETAILED DESCRIPTION OF PREFERRED EMBODIMENTS

Figure 1A:
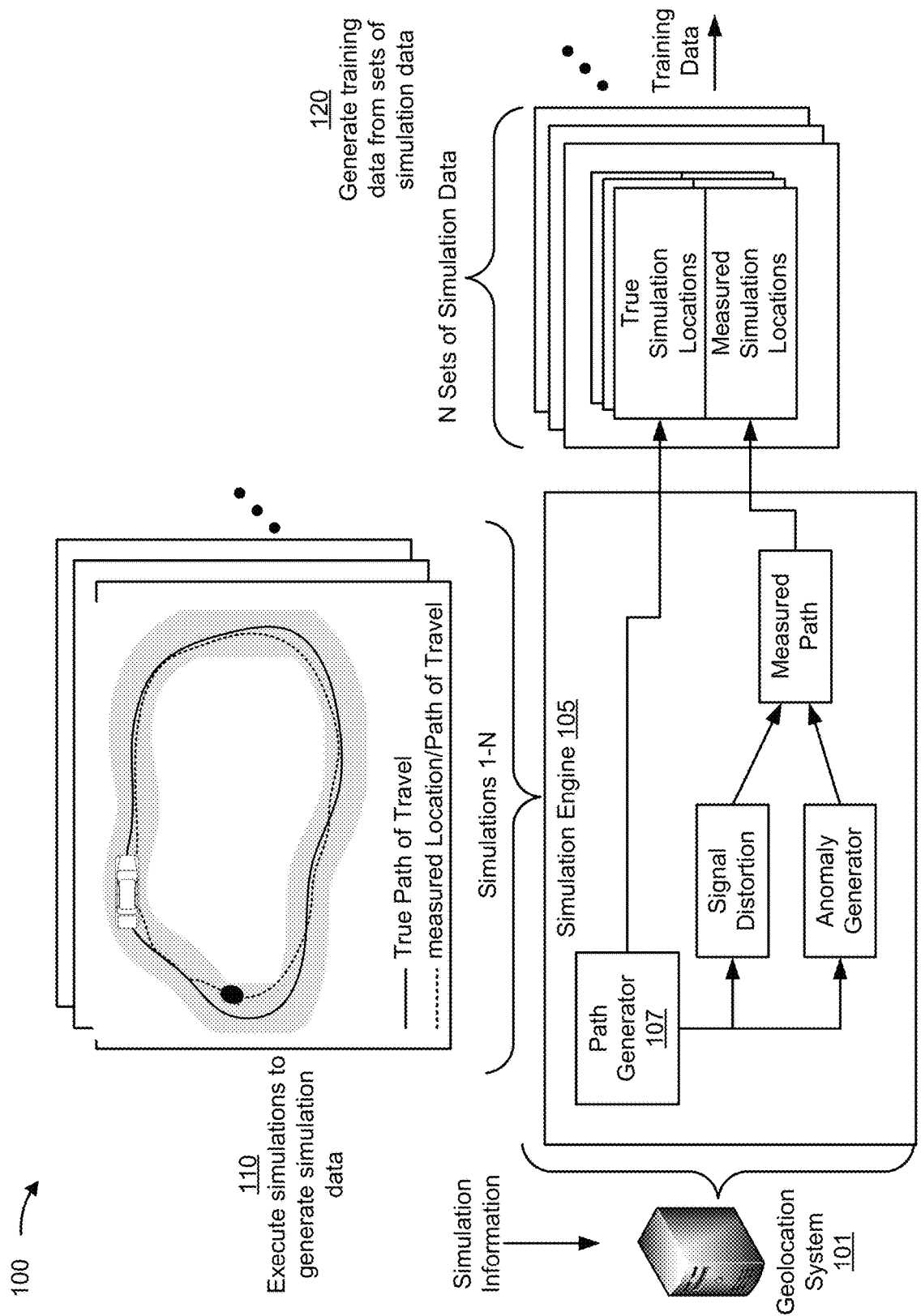
FIGS. 1A-1D are diagrams of an example implementation described herein.

The following detailed description of example implementations refers to the accompanying drawings. The same reference numbers in different drawings may identify the same or similar elements.

A geolocation unit (e.g., a global positioning system (GPS) device), a global navigation satellite systems (GNSS) device, and/or the like) may determine a location of the geolocation unit based on a radio frequency (RF) signal received from a satellite. The RF signal may include information identifying the satellite and a navigation message. The navigation message may include information identifying a position of the satellite (e.g., information identifying orbital data associated with the satellite) and information identifying a time associated with the position of the satellite. The geolocation unit may utilize the RF signal received from multiple satellites to determine the location of the geolocation unit. For example, the geolocation unit may determine a distance the geolocation unit is from each satellite and may determine the location of the geolocation unit based on the distances through trilateration.

Commonly, the received RF signals include substantial amounts of noise resulting from atmospheric conditions, geographic conditions, and/or the like. The substantial amounts of noise may result in inaccuracies in the determined location. Using heuristic and simulated models of motion may be used to increase the accuracy of the determined location. However, the heuristic and simulated models are complex, thereby increasing an amount of computing resources (e.g., processing resources, memory resources, communication resources, and/or the like) utilized by the geolocation unit. Further, the heurist and simulated models may have difficulty with noise that cannot be expressed formulaically.

In some cases, machine learning models may be used to reduce the inaccuracies in the determined location. However, a large amount of time and computing resources may be needed to obtain the volume and variety of training data required for training the machine learning models to achieve a sufficient degree of accuracy. Further, it may be difficult to obtain training data that includes a large variety of outlier events, such as occlusions and/or blocking of the RF signal that may be experienced by the geolocation unit.

Some implementations described herein relate to a geolocation system for performing a simulation of a geolocation unit moving along a path to generate training data for a machine learning model that is configured to adjust and/or account for inaccuracies of the geolocation unit caused by noise in the RF signal received from one or more satellites. For example, the geolocation system may execute the simulation to generate a simulated RF signal corresponding to an actual or real RF signal received by the geolocation unit as the geolocation unit travels along the path. The geolocation system may modify the RF signal to represent noise in the actual RF signal. Additionally, the geolocation system may randomly modify the modified signal to represent outlier events. The geolocation system may utilize the modified signal and information indicating a true location of the geolocation unit to train the machine learning model to determine a location of the geolocation unit based on the modified signal.

By modifying an RF signal generated based on simulating a geolocation unit traveling along the path, the geolocation system may generate large amounts of training data relative to an amount of training that that may otherwise be available for training the machine learning model. Further, by randomly modifying the modified signal, the training data used to train the machine learning model may include a large variety of outlier events. Using the large amounts of training data, including a large variety of outlier events, to train the machine learning model may improve an accuracy of the machine learning model associated with adjusting and/or accounting for inaccuracies of the geolocation unit resulting from noise in the reported values.

Accordingly, the geolocation system may conserve computing resources (e.g., processing resources, memory resources, communication resources, and/or the like) associated with identifying, obtaining, and/or generating actual historical data to train the model relative to other systems for identifying, obtaining, and/or generating historical data for training the model. Further, by improving the accuracy of the model, the geolocation system may conserve computing resources associated with inaccurately determining the location of the vehicle, performing a corrective action associated with the location of the vehicle being inaccurately determined, and/or the like.

FIGS. 1A-1D are diagrams of one or more example implementations 100 described herein. As shown in FIGS. 1A-1D, the one or more example implementations 100 include a user device 103 associated with a geolocation system 101. The user device 103 may include a device, such as a computer, a laptop, a tablet, a smart phone, and/or the like, that includes a geolocation unit for determining a location of the user device 103.

As shown in FIG. 1A, and by reference number 110, the geolocation system 101 executes simulations based on simulation information to generate simulation data. The simulation information may include information associated with executing the simulations. For example, the simulation information may include geolocation unit information (e.g., information associated with a geolocation unit associated with the simulation (e.g., a type of geolocation unit, a brand associated with the geolocation unit, a model of the geolocation unit, an accuracy associated with the geolocation unit, and/or the like), motion information (e.g., information identifying a motion type associated with the simulations (e.g., driving, walking, flying, and/or the like), information identifying a path of travel, information identifying a speed of travel, information identifying a quantity of simulations to be executed, location information (e.g., information identifying a geographic area associated with the simulations, map data associated with the geographic area, and/or the like), and/or the like. The above-listed information is intended to be merely examples of types of information that may be included in the simulation information. In practice, the simulation information may include any one or more of the above-listed types of information and/or one or more other types of information not listed above.

In some implementations, the simulation information is input by a user. The user may input the simulation information via a user interface displayed on a client device (e.g., a computer, a laptop, a mobile device, and/or the like) associated with the geolocation system 101. The client device may receive the input simulation information and may provide the simulation information to the geolocation system 101.

In some implementations, the geolocation system 101 determines the simulation information. For example, the geolocation system 101 may determine the simulation information based on information input by a user. The user may input information identifying a type of geolocation unit, an application for which a geolocation unit is to be used, and/or the like via the user interface. The geolocation system 101 may determine the simulation information based on the input information. As an example, the user may input information identifying a particular type of geolocation unit (e.g., a geolocation unit included in a mobile device, a geolocation unit included in a vehicle, a hand-held geolocation unit, and/or the like). The geolocation system 101 may determine the simulation information based on the particular type of geolocation unit. For example, the geolocation system 101 may determine a type of motion associated with the particular type of geolocation unit, an accuracy associated with the particular type of geolocation unit, and/or the like.

In some implementations, the geolocation system 101 utilizes a simulation engine 105 to execute the simulations. The simulation engine 105 may include a path generator 107. The path generator 107 may be configured to generate a path over which the geolocation unit is to travel during a simulation. The path generator 107 may generate the path based on the information identifying the path of travel, the motion information, the location information, and/or the like.

As an example, the path generator 107 may determine that the motion type associated with the geolocation unit is traveling based on the motion information. The path generator 107 may identify a geographic area associated with the simulation and/or a group of roadways included in the geographic area based on the location information. The path generator 107 may determine a series of locations along the group of roadways based on map data associated with the geographic area and included in the simulation information. The path generator 107 may generate a path of travel based on the series of locations (e.g., a true path of travel, as shown in FIG. 1A).

The simulation engine 105 may execute the simulation by generating a signal representing an RF signal received by the geolocation unit as the geolocation unit travels along the path of travel. The simulation engine 105 may determine an initial location (e.g., a location at a time $T_0$) of the geolocation unit (e.g., a vehicle including the geolocation unit, as shown in FIG. 1A) based on the true path of travel. The simulation engine 105 may generate an initial signal corresponding to an RF signal that may be received by the geolocation unit at the initial location. The initial signal may include information that can be used by the geolocation unit to determine a location of the geolocation unit at the time $T_0$. For example, the initial signal may include information identifying a satellite associated with the signal, information identifying a position of the satellite (e.g., information identifying orbital data associated with the satellite) information identifying a time associated with the position of the satellite, and/or the like.

The simulation engine 105 may determine a frequency at which the geolocation unit receives an RF signal from a satellite (e.g., every 5 milliseconds, every second, every minute, and/or the like) based on the simulation information. For example, the simulation information may include information indicating a type of the geolocation unit. The simulation engine 105 may determine a frequency at which the type of the geolocation unit receives RF signals from a satellite.

The simulation engine 105 may determine a next location of the geolocation unit (e.g., a location at time Ti) based on the true path of travel, the frequency at which the geolocation unit receives RF signals from the satellite, a speed at which the geolocation unit is traveling indicated in the simulation information, and/or the like. The simulation engine 105 may generate a signal corresponding to an RF signal received by the geolocation unit at the next location in a manner similar to that described above. The simulation engine 105 may generate a series of signals corresponding to RF signals received by the geolocation unit as the geolocation unit travels along the path of travel, in a manner similar to that described above.

The geolocation system 101 may determine a quantity of simulations based on the simulation information. The geolocation system 101 may cause the simulation engine 105 to execute the quantity of simulations to generate a respective series of signals for each simulation, in a manner similar to that described above.

As shown by reference number 120, the geolocation system 101 generates training data from the sets of simulation data. The training data may include a plurality of sets of simulation data. Each set of simulation data, of the plurality of sets of simulation data, may be associated with a respective simulation of the simulations executed by the simulation engine 105.

A set of simulation data, of the plurality of sets of simulation data, may be associated with a simulation and may include information identifying the true path of travel associated with the simulation and the series of signals generated based on executing the simulation. To simulate noise that may be included in location information obtained by a physical geolocation unit, the geolocation system 101 may modify the series of signals.

In some implementations, the geolocation system 101 may modify the series of signals based on a Gaussian noise included in a corresponding RF signal. The Gaussian noise may be a statistical noise having a probability density function (PDF) equal to that of a normal or Gaussian distribution. The geolocation system 101 may apply a level of Gaussian noise to the series of signals to modify the series of signals.

In some implementations, the geolocation system 101 may utilize a set of one or more filters to modify the series of signals. For example, the geolocation system 101 may cause the series of signals to pass through the set of one or more filters to modify each signal included in the series of signals. The one or more filters may be configured to modify the series of signals based on a distribution associated with noise included in an RF signal received by the geolocation unit.

In some implementations, the geolocation system 101 may further modify one or more of the modified series of signals to generate one or more outlier signals. The one or more outlier signals may represent an occlusion of an RF signal generated by a satellite, a blocking of the RF signal generated by the satellite, and/or the like. As an example, the geolocation system 101 may determine, based on location information (e.g., map data) included in the simulation information, that the geolocation unit travels through a tunnel as the geolocation unit travels along the path of travel. The geolocation system 101 may further modify one or more of the modified series of signals to generate an outlier signal representing an occlusion of an RF signal generated by a satellite caused by the geolocation unit traveling through the tunnel.

In some implementations, the geolocation system 101 generates the one or more outlier signals by including a larger amount of Gaussian noise (e.g., noise comprising 75%, 80%, 90%, and/or the like of the one or more outlier signals) in one or more of the modified series of signals relative to an amount of Gaussian noise included in other ones of the modified series of signals. The geolocation system 101 may apply a first level of Gaussian noise to a first group of signals, of the series of signals to modify the first group of signals. The geolocation system 101 may apply a second level of Gaussian noise to a second group of signals, of the series of signals to generate the one or more outlier signals. A maximum of a range of the first level of Gaussian noise may be less than or equal to a threshold percentage of a minimum of a range of the second level of Gaussian noise.

In some implementations, the first time period is associated with a first set of timestamps of the simulation and the second time period is associated with a second set of timestamps of the simulation. A quantity of the first set of timestamps may be greater than or equal to a threshold percentage of a total quantity of timestamps associated with a combination of the first time period and the second time period. A quantity of the second set of timestamps may be less than the threshold percentage of the total quantity of timestamps.

In some implementations, the geolocation system 101 generates the one or more outlier signals by time interleaving interrupts (e.g., inserting zeros) into the one or more modified signals. The geolocation system 101 may time interleave the interrupts into the one or more modified signals to represent an obstacle (e.g., an overpass, a tunnel, a large building, and/or the like) that may interrupt the RF signal transmitted by the satellite.

Figure 1B:
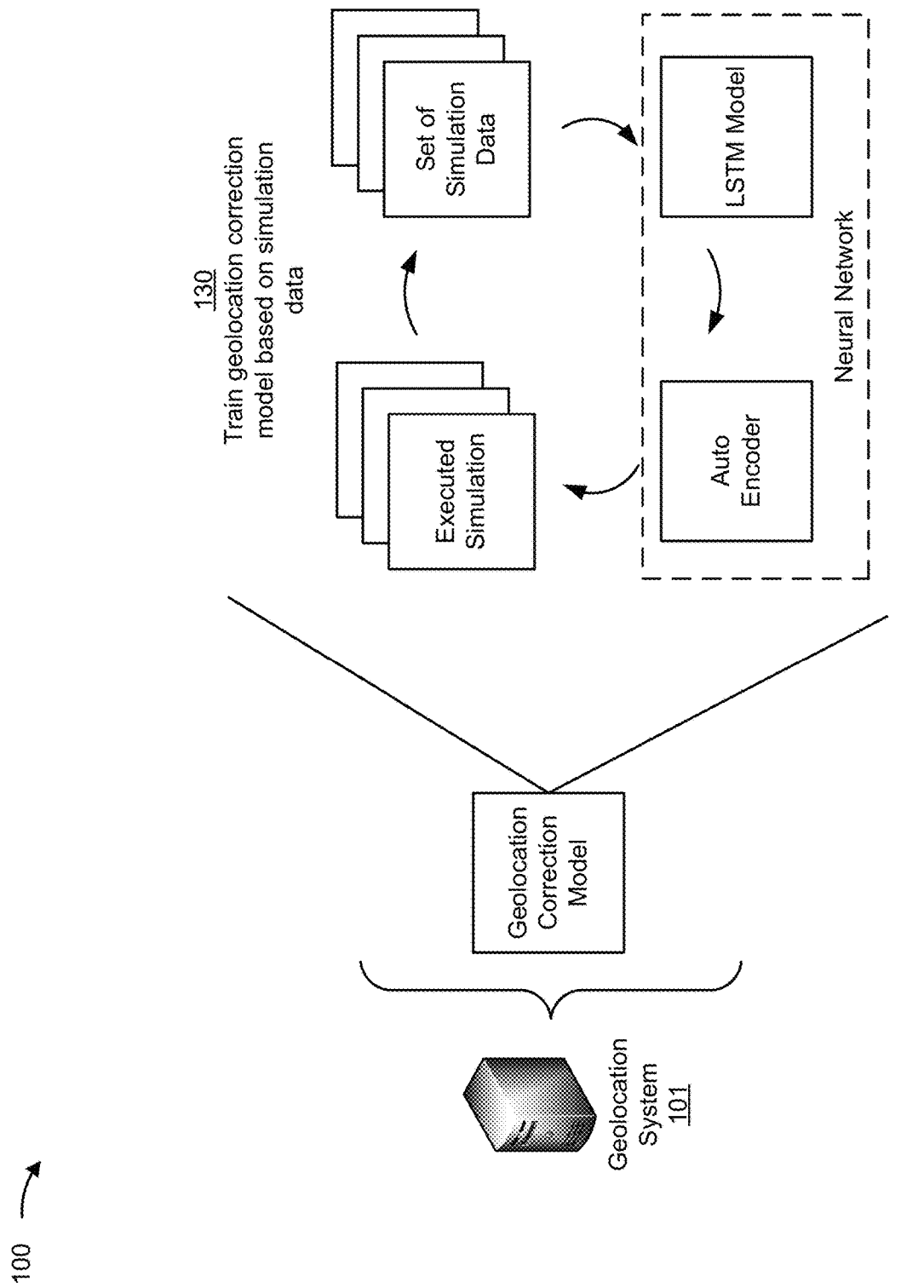

As shown in FIG. 1B, and by reference number 130, the geolocation system 101 trains the geolocation correction model based on the simulation data. In some implementations, the geolocation system 101 trains the geolocation correction model based on a motion type associated with the geolocation unit. The geolocation system 101 may determine a type of motion associated with the geolocation unit and/or the training data and may train the geolocation correction model to determine a location for a geolocation unit associated with the type of motion. For example, the geolocation system 101 may determine that the geolocation unit and/or the training data is associated with a driving type of motion. The geolocation system 101 may use the training data to train the geolocation correction model to determine a location based on RF signals received by a geolocation unit associated with the driving type of motion (e.g., a geolocation unit included in a vehicle). As another example, the geolocation system 101 may determine that the geolocation unit and/or the training data is associated with a walking type of motion. The geolocation system 101 may use the training data to train the geolocation correction model to determine a location based on RF signals received by a geolocation unit associated with the walking type of motion (e.g., a hand-held geolocation unit).

In some implementations, the geolocation system 101 may use the training data to train the geolocation correction model in near real-time relative to when the training data is generated. As an example, the geolocation system 101 may cause a modified signal to be stored in a memory (e.g., a queue, a data structure, and/or the like) based on the modified signal passing through the one or more filters used to modify the series of signals.

The geolocation system 101 may cause the stored modified signal and information identifying a true location of the geolocation unit to be provided to the geolocation correction model as inputs. The geolocation correction model may utilize a neural network to process the inputs and may generate a measured location of the geolocation unit as a result. Alternatively, and/or additionally, the geolocation correction model may utilize a convolutional neural network, a Siamese network, and/or the like to process the inputs.

In some implementations, the neural network is a recurrent neural network such as a long short-term memory (LSTM) network. The recurrent neural network may be a network that is configured to store information associated with past inputs for an amount of time that is determined based on the input data. The stored data may be utilized to determine a context associated with the inputs such as the effect a previous input may have on a current input.

Alternatively, and/or additionally, the neural network may include an autoencoder. The autoencoder may learn a representation for a set of data (e.g., a modified series of signals) by training the neural network to ignore noise included in the data.

The geolocation system 101 may provide a next stored modified signal and information identifying a true location of the geolocation unit associated with the modified signal as inputs to the geolocation correction model based on the geolocation model outputting the result. The geolocation system 101 may utilize the neural network to process the inputs and to generate a result in a manner similar to that described above. The process may continue in a similar manner for each modified signal included in the modified series of signals. The geolocation correction model may process each set of training data in a manner similar to that described above. In some implementations, the geolocation system 101 may train the geolocation correction model in a manner similar to that described below with respect to FIG. 2.

In some implementations, the information identifying the true location of the geolocation unit corresponds to a location of the geolocation unit associated with the modified signal. In some implementations, the information identifying the true location of the geolocation unit corresponds to a subsequent or future location of the geolocation unit with respect to the location of the geolocation unit associated with the modified signal. The subsequent or future true location of the geolocation unit may be utilized to account for a time lag associated with an RF signal received by the geolocation unit. For example, the geolocation system 101 may determine an amount of time associated with an RF signal traveling from the satellite to the geolocation unit. The geolocation system 101 may determine a distance that the geolocation unit may travel along the path of movement during the amount of time based on information identifying a speed of the geolocation unit and/or an acceleration of the geolocation unit included in the simulation information. The geolocation system 101 may determine the subsequent or future location of the geolocation unit based on the distance that the geolocation unit may travel along the path of movement during the amount of time. In this way, the geolocation system 101 may train the geolocation correction model to account for a delay or time lag associated with the RF signal received by the geolocation unit.

In some implementations, the geolocation correction model may determine the amount of time during the training of the geolocation correction model. The geolocation correction model may determine an initial amount of time based on time lags associated with actual RF signals received by geolocation units associated with the type of motion associated with the training data. The geolocation correction model may modify or adjust the amount of time based on comparing a location of the geolocation unit determined by the geolocation correction model and the subsequent or future true location of the geolocation unit.

Figure 1C:
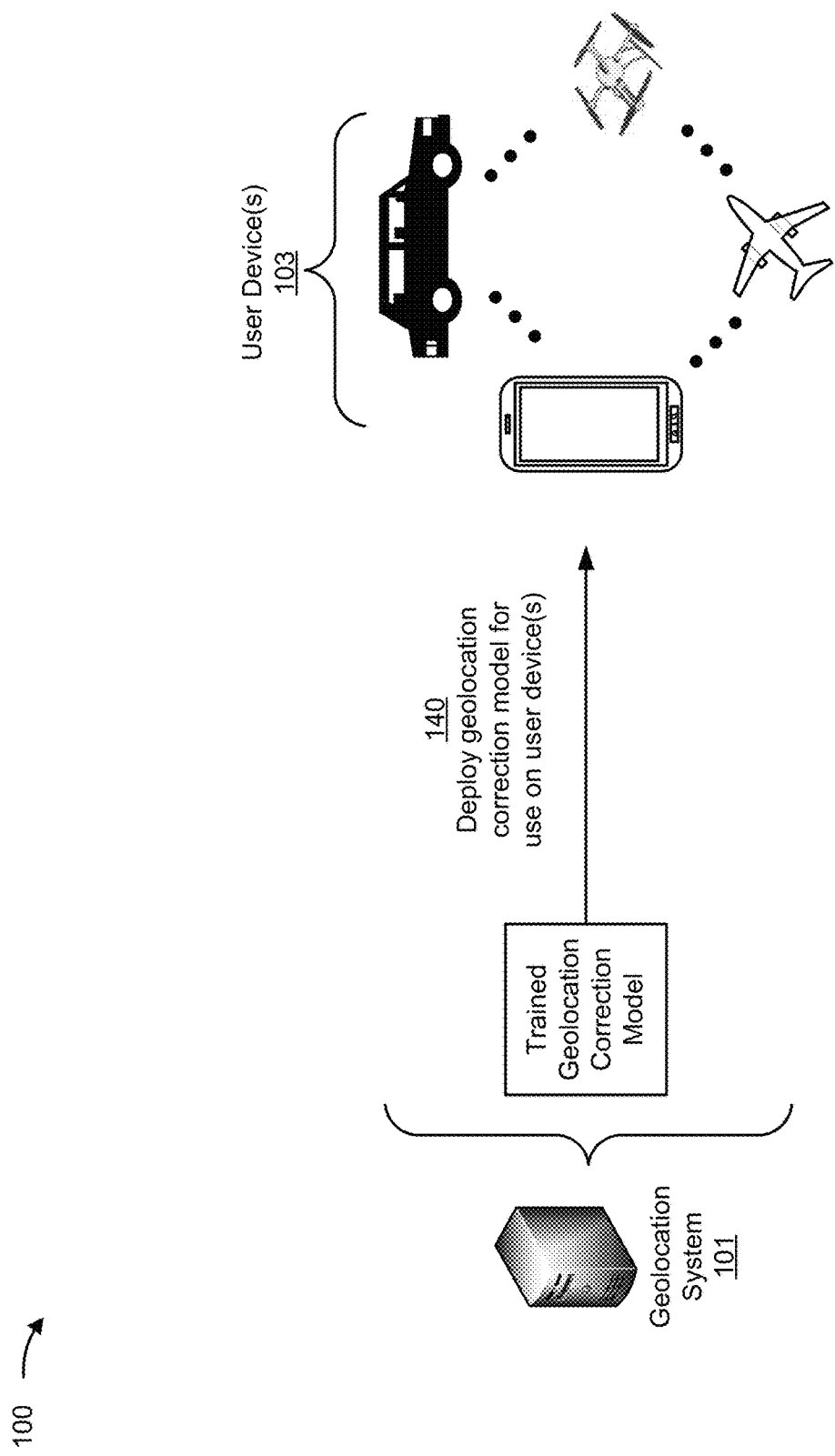

As shown in FIG. 1C, and by reference number 140, the geolocation system 101 deploys the geolocation correction model for use on the user device 103. In some implementations, the geolocation system 101 deploys the geolocation correction model for use on the user device 103 based on a type of the geolocation unit. For example, the geolocation system 101 may determine that the geolocation unit is a type of geolocation unit included in a mobile device. The geolocation system 101 may enable the geolocation correction model to be installed on the mobile device to deploy the geolocation correction model for use on the mobile device (e.g., user device 103), may provide the geolocation correction model to a network device to enable the user device 103 to access, from the network device, the geolocation correction model to process received RF signals, and/or the like.

In some implementations, the network device may be an edge network device included in a multi-access edge computing (MEC) environment. In the MEC environment, computing may be enabled by a network architecture that provides computing capabilities, to the user device 103, via computing platforms at or near an edge of the network (e.g., a wireless communication network). Because the MEC environment may provide computing capabilities at or near the edge of the network, increased performance may be achieved over network in which computation is performed topologically and/or physically further from the user device 103. For example, the MEC environment may increase performance due to less traffic and/or congestion between the user device 103 and the edge network device, less latency (e.g., due to the closer proximity to the user device 103), and/or the like.

Figure 1D:
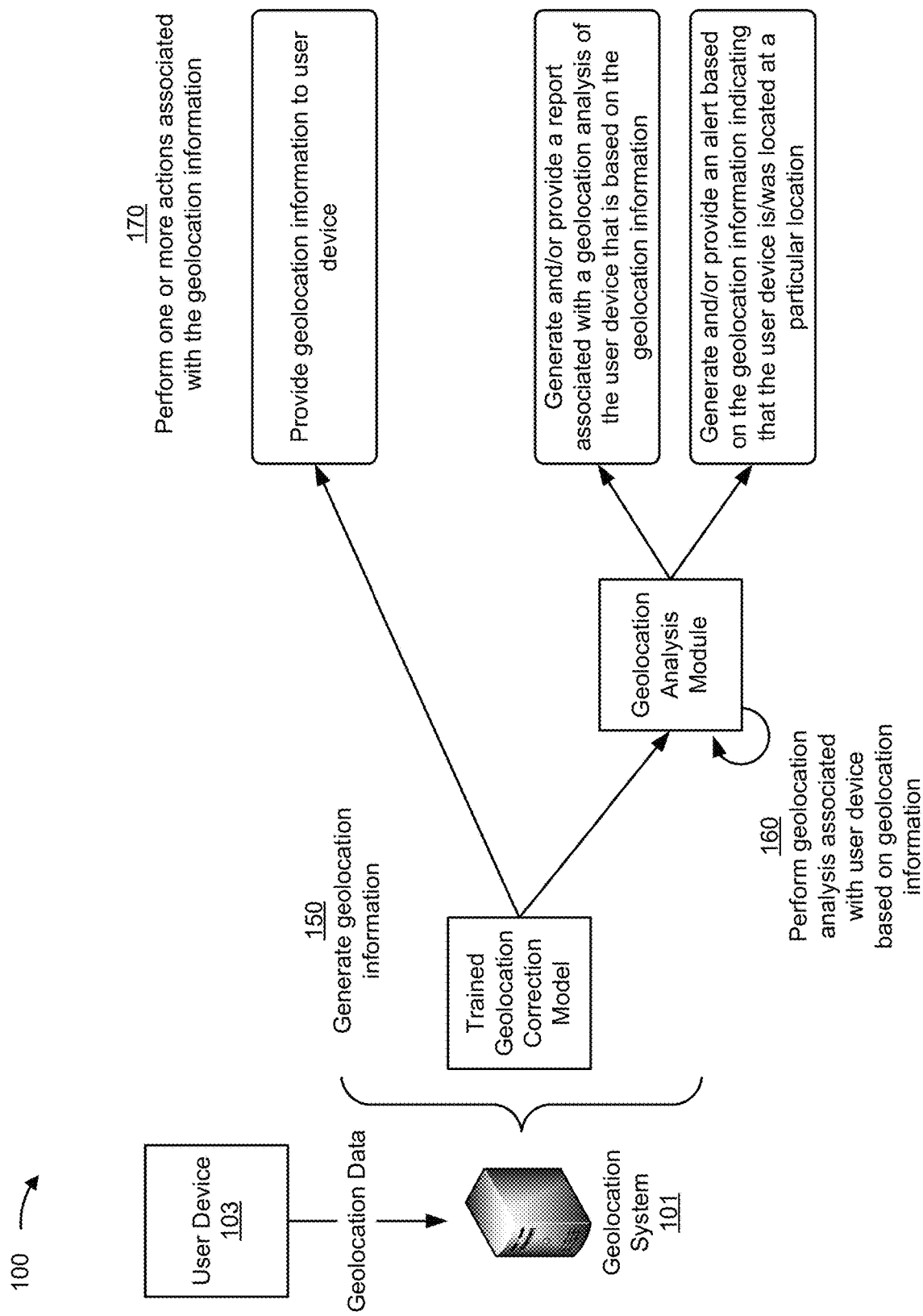

As shown in FIG. 1D, and by reference number 150, the geolocation correction model generates geolocation information based on geolocation data received from the user device 103. The user device 103 (e.g., the geolocation unit included in the user device 103) may obtain geolocation data (e.g., information included in an RF signal received from a satellite) and may utilize the geolocation correction model to determine geolocation information indicating a location of the user device 103 based on the geolocation data. For example, the geolocation correction model may be deployed on a network device (e.g., the edge network device of the MEC environment). The user device 103 may provide the geolocation data to the geolocation correction model via the MEC environment. The geolocation correction model may process the geolocation data to determine the geolocation information. The geolocation information may include information indicating a location of the user device 103.

As shown by reference number 160, the geolocation system 101 performs geolocation analysis associated with the user device 103 based on the geolocation information. The geolocation analysis may include processing the geolocation information to determine a location of the user device 103, the geolocation unit included in the user device 103, a user associated with the user device 103, and/or the like.

As shown by reference number 170, the geolocation system 101 performs one or more actions associated with the geolocation information. In some implementations, the one or more actions include providing the geolocation information to the user device 103. The user device 103 may utilize the geolocation information to determine a location of the user device 103. In this way, the user device 103 may determine a more accurate location of the user device 103 relative to a location of the user device 103 determined by the user device 103 and/or the geolocation unit included in the user device 103. Further, utilizing the geolocation correction model to generate the geolocation information may enable the user device 103 to conserve computing resources that would otherwise be utilized to generate the geolocation information.

In some implementations, the one or more actions include generating and/or providing a report associated with a geolocation analysis of the user device 103 that is based on the geolocation information. The report may include information identifying the location of the user device 103. The user device 103 may receive the report and may provide the information identifying the location of the user device 103 for display to the user. In this way, the user device 103 may conserve computing resources that would otherwise be utilized to determine the location of the user device 103 based on the geolocation information.

In some implementations, the one or more actions include generating and/or providing an alert based on the geolocation information indicating that the user device 103 is/was located at a particular location. The geolocation data received from the user device 103 may include information identifying the user device 103 and/or a user associated with the user device 103. The geolocation system 101 may identify the user device 103 and/or the user associated with the user device 103 based on the geolocation data. The geolocation system 101 may obtain a user profile associated with the user based on the identity of the user and/or the user device 103. The geolocation system 101 may determine that user associated with a service for providing alerts regarding the location of the user (e.g., a service for providing information to the user (e.g., via the user device 103) when the user is located a particular location, within a predetermined distance of another user, and/or the like) based on the user profile. The geolocation system 101 may generate and/or provide an alert to the user and/or to another user (e.g., via another user device 103) based on the geolocation information indicating that the user is at the particular location.

As indicated above, FIGS. 1A-1D are provided as an example. Other examples may differ from what is described with regard to FIGS. 1A-1D. The number and arrangement of devices shown in FIGS. 1A-1D are provided as an example. In practice, there may be additional devices, fewer devices, different devices, or differently arranged devices than those shown in FIGS. 1A-1D. Furthermore, two or more devices shown in FIGS. 1A-1D may be implemented within a single device, or a single device shown in FIGS. 1A-1D may be implemented as multiple, distributed devices. Additionally, or alternatively, a set of devices (e.g., one or more devices) shown in FIGS. 1A-1D may perform one or more functions described as being performed by another set of devices shown in FIGS. 1A-1D.

Figure 2:
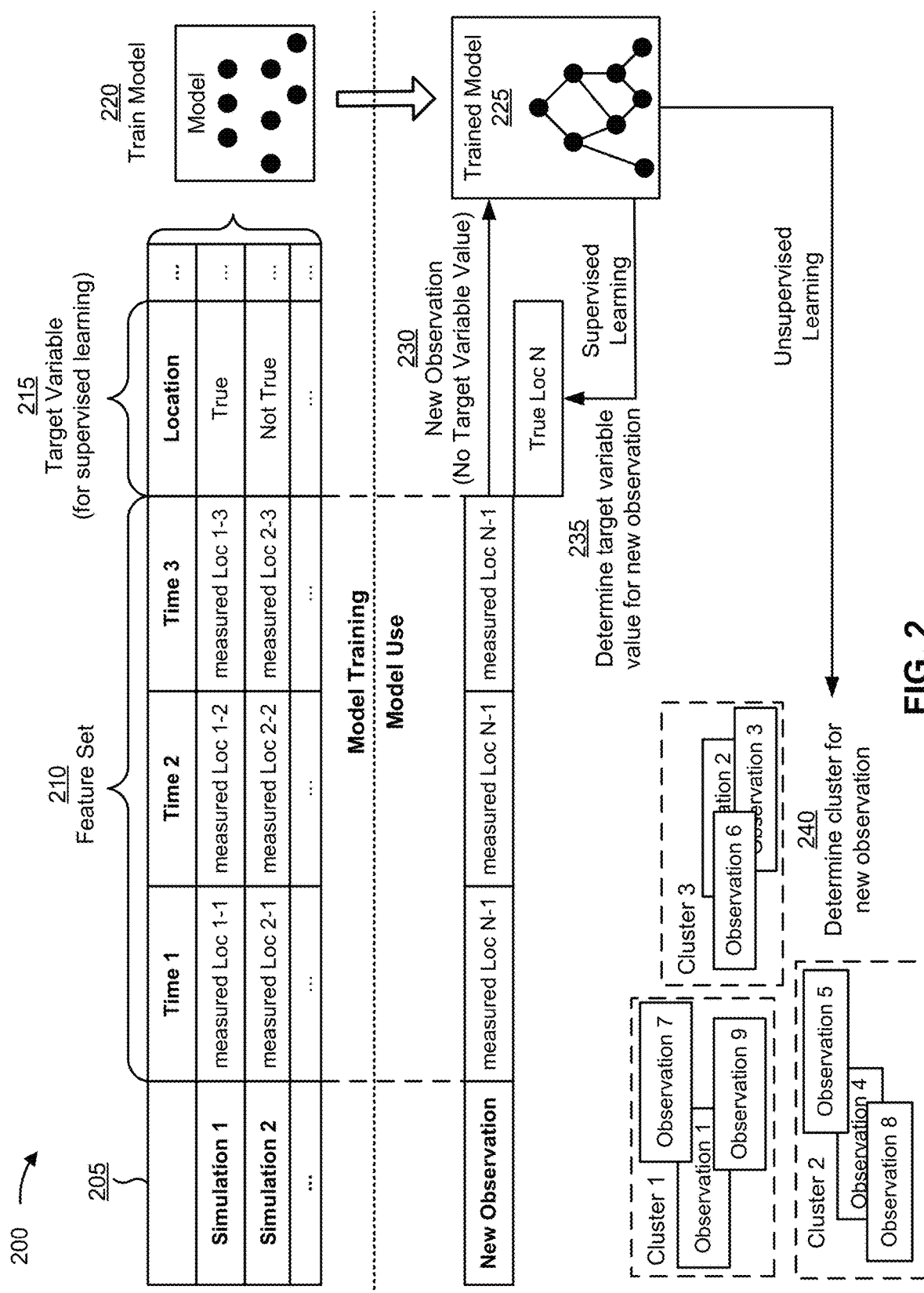
FIG. 2 is a diagram illustrating an example of training and using a machine learning model in connection with generating geolocation information.

FIG. 2 is a diagram illustrating an example 200 of training and using a machine learning model in connection with generating geolocation information. The machine learning model training and usage described herein may be performed using a machine learning system. The machine learning system may include or may be included in a computing device, a server, a cloud computing environment, and/or the like, such as the geolocation system 101 described in more detail elsewhere herein.

As shown by reference number 205, a machine learning model may be trained using a set of observations (e.g., Simulation 1 and Simulation 2, as shown in FIG. 2). The set of observations may be obtained from historical data, such as data gathered during one or more processes described herein. In some implementations, the machine learning system may receive the set of observations (e.g., as input) from the geolocation system 101, as described elsewhere herein.

As shown by reference number 210, the set of observations includes a feature set. The feature set may include a set of variables, and a variable may be referred to as a feature. A specific observation may include a set of variable values (or feature values) corresponding to the set of variables. In some implementations, the machine learning system may determine variables for a set of observations and/or variable values for a specific observation based on input received from geolocation system 101. For example, the machine learning system may identify a feature set (e.g., one or more features and/or feature values) by extracting the feature set from structured data, by performing natural language processing to extract the feature set from unstructured data, by receiving input from an operator, and/or the like.

As an example, a feature set for a set of observations may include a first feature of Time 1, a second feature of Time 2, a third feature of Time 3, and so on. As shown, for a first observation, the first feature may have a value of measured Loc 1-1, the second feature may have a value of measured Loc 1-2, the third feature may have a value of measured Loc 1-3, and so on. These features and feature values are provided as examples, and may differ in other examples.

As shown by reference number 215, the set of observations may be associated with a target variable. The target variable may represent a variable having a numeric value, may represent a variable having a numeric value that falls within a range of values or has some discrete possible values, may represent a variable that is selectable from one of multiple options (e.g., one of multiples classes, classifications, labels, and/or the like), may represent a variable having a Boolean value, and/or the like. A target variable may be associated with a target variable value, and a target variable value may be specific to an observation. In example 200, the target variable is Location, which has a value of True for the first observation. The value of True may indicate that the machine learning model accurately determined the location for the observation based on the set of features.

The target variable may represent a value that a machine learning model is being trained to predict, and the feature set may represent the variables that are input to a trained machine learning model to predict a value for the target variable. The set of observations may include target variable values so that the machine learning model can be trained to recognize patterns in the feature set that lead to a target variable value. A machine learning model that is trained to predict a target variable value may be referred to as a supervised learning model.

In some implementations, the machine learning model may be trained on a set of observations that do not include a target variable. This may be referred to as an unsupervised learning model. In this case, the machine learning model may learn patterns from the set of observations without labeling or supervision, and may provide output that indicates such patterns, such as by using clustering and/or association to identify related groups of items within the set of observations.

As shown by reference number 220, the machine learning system may train a machine learning model using the set of observations and using one or more machine learning algorithms, such as a regression algorithm, a decision tree algorithm, a neural network algorithm, a k-nearest neighbor algorithm, a support vector machine algorithm, and/or the like. After training, the machine learning system may store the machine learning model as a trained machine learning model 225 to be used to analyze new observations.

As shown by reference number 230, the machine learning system may apply the trained machine learning model 225 to a new observation, such as by receiving a new observation and inputting the new observation to the trained machine learning model 225. As shown, the new observation may include a first feature of measured Loc N-1, a second feature of measured Loc N-2, a third feature of measured Loc N-3, and so on, as an example. The machine learning system may apply the trained machine learning model 225 to the new observation to generate an output (e.g., a result). The type of output may depend on the type of machine learning model and/or the type of machine learning task being performed. For example, the output may include a predicted value of a target variable, such as when supervised learning is employed. Additionally, or alternatively, the output may include information that identifies a cluster to which the new observation belongs, information that indicates a degree of similarity between the new observation and one or more other observations, and/or the like, such as when unsupervised learning is employed.

As an example, the trained machine learning model 225 may predict a value of True Loc N for the target variable of Location for the new observation, as shown by reference number 235. Based on this prediction, the machine learning system may provide a first recommendation, may provide output for determination of a first recommendation, may perform a first automated action, may cause a first automated action to be performed (e.g., by instructing another device to perform the automated action), and/or the like.

In some implementations, the trained machine learning model 225 may classify (e.g., cluster) the new observation in a cluster, as shown by reference number 240. The observations within a cluster may have a threshold degree of similarity. As an example, if the machine learning system classifies the new observation in a first cluster (e.g., Location True), then the machine learning system may provide a first recommendation. Additionally, or alternatively, the machine learning system may perform a first automated action and/or may cause a first automated action to be performed (e.g., by instructing another device to perform the automated action) based on classifying the new observation in the first cluster.

As another example, if the machine learning system were to classify the new observation in a second cluster (e.g., Location Not True), then the machine learning system may provide a second (e.g., different) recommendation and/or may perform or cause performance of a second (e.g., different) automated action.

In some implementations, the recommendation and/or the automated action associated with the new observation may be based on a target variable value having a particular label (e.g., classification, categorization, and/or the like), may be based on whether a target variable value satisfies one or more threshold (e.g., whether the target variable value is greater than a threshold, is less than a threshold, is equal to a threshold, falls within a range of threshold values, and/or the like), may be based on a cluster in which the new observation is classified, and/or the like.

In this way, the machine learning system may apply a rigorous and automated process to generating geolocation information. The machine learning system enables recognition and/or identification of tens, hundreds, thousands, or millions of features and/or feature values for tens, hundreds, thousands, or millions of observations, thereby increasing accuracy and consistency and reducing delay associated with generating geolocation information relative to requiring computing resources to be allocated for tens, hundreds, or thousands of operators to manually generating geolocation information using the features or feature values.

As indicated above, FIG. 2 is provided as an example. Other examples may differ from what is described in connection with FIG. 2.

Figure 3:
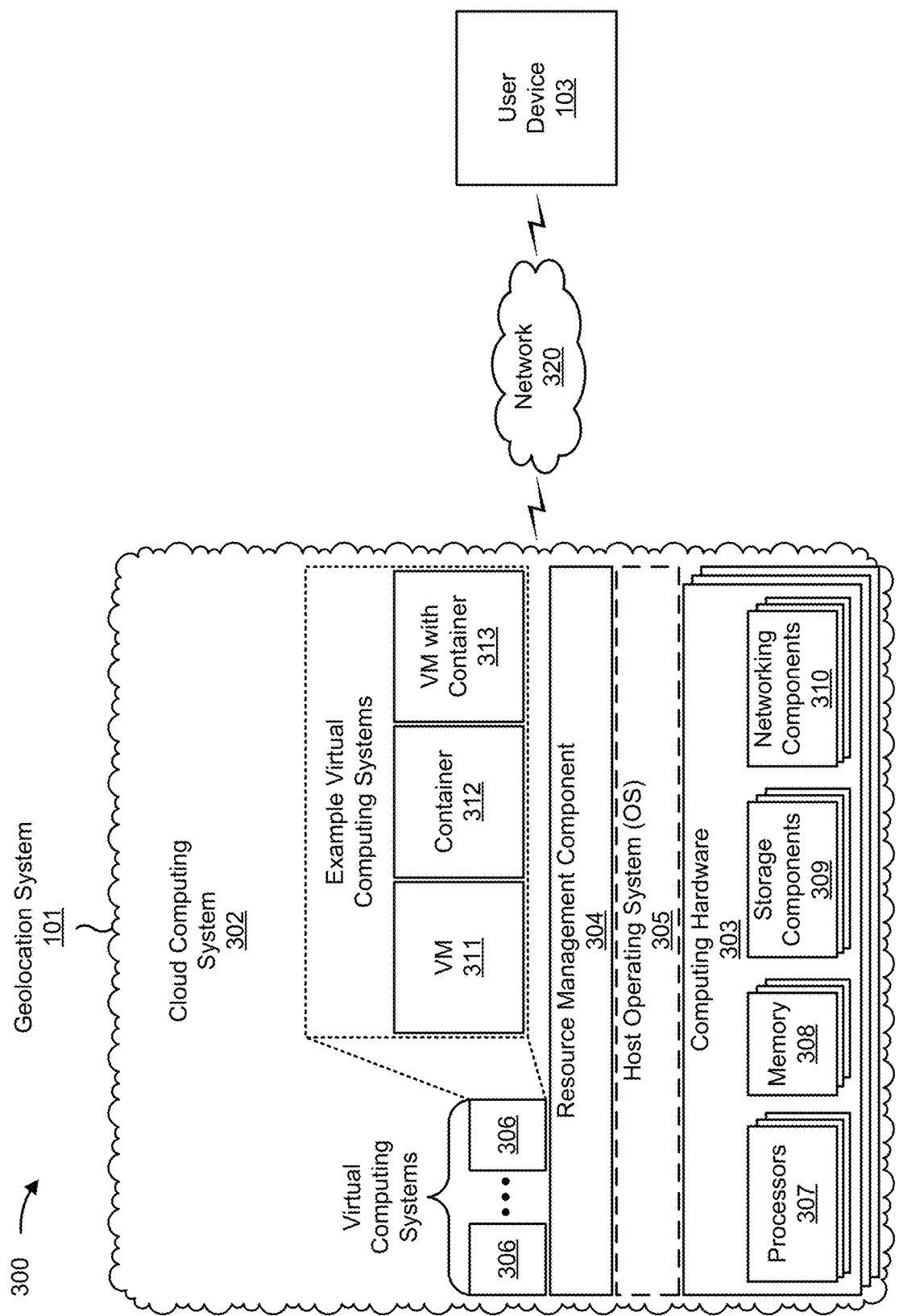
FIG. 3 is a diagram of an example environment in which systems and/or methods described herein may be implemented.

FIG. 3 is a diagram of an example environment 300 in which systems and/or methods described herein may be implemented. As shown in FIG. 3, environment 300 may include a geolocation system 101, which may include one or more elements of and/or may execute within a cloud computing system 302. The cloud computing system 302 may include one or more elements 303-313, as described in more detail below. As further shown in FIG. 3, environment 300 may include a network 320 and/or a user device 103. Devices and/or elements of environment 300 may interconnect via wired connections and/or wireless connections.

The cloud computing system 302 includes computing hardware 303, a resource management component 304, a host operating system (OS) 305, and/or one or more virtual computing systems 306. The resource management component 304 may perform virtualization (e.g., abstraction) of computing hardware 303 to create the one or more virtual computing systems 306. Using virtualization, the resource management component 304 enables a single computing device (e.g., a computer, a server, and/or the like) to operate like multiple computing devices, such as by creating multiple isolated virtual computing systems 306 from computing hardware 303 of the single computing device. In this way, computing hardware 303 can operate more efficiently, with lower power consumption, higher reliability, higher availability, higher utilization, greater flexibility, and lower cost than using separate computing devices.

Computing hardware 303 includes hardware and corresponding resources from one or more computing devices. For example, computing hardware 303 may include hardware from a single computing device (e.g., a single server) or from multiple computing devices (e.g., multiple servers), such as multiple computing devices in one or more data centers. As shown, computing hardware 303 may include one or more processors 307, one or more memories 308, one or more storage components 309, and/or one or more networking components 310. Examples of a processor, a memory, a storage component, and a networking component (e.g., a communication component) are described elsewhere herein.

The resource management component 304 includes a virtualization application (e.g., executing on hardware, such as computing hardware 303) capable of virtualizing computing hardware 303 to start, stop, and/or manage one or more virtual computing systems 306. For example, the resource management component 304 may include a hypervisor (e.g., a bare-metal or Type 1 hypervisor, a hosted or Type 2 hypervisor, and/or the like) or a virtual machine monitor, such as when the virtual computing systems 306 are virtual machines 311. Additionally, or alternatively, the resource management component 304 may include a container manager, such as when the virtual computing systems 306 are containers 312. In some implementations, the resource management component 304 executes within and/or in coordination with a host operating system 305.

A virtual computing system 306 includes a virtual environment that enables cloud-based execution of operations and/or processes described herein using computing hardware 303. As shown, a virtual computing system 306 may include a virtual machine 311, a container 312, a hybrid environment 313 that includes a virtual machine and a container, and/or the like. A virtual computing system 306 may execute one or more applications using a file system that includes binary files, software libraries, and/or other resources required to execute applications on a guest operating system (e.g., within the virtual computing system 306) or the host operating system 305.

Although the geolocation system 101 may include one or more elements 303-313 of the cloud computing system 302, may execute within the cloud computing system 302, and/or may be hosted within the cloud computing system 302, in some implementations, the geolocation system 101 may not be cloud-based (e.g., may be implemented outside of a cloud computing system) or may be partially cloud-based. For example, the geolocation system 101 may include one or more devices that are not part of the cloud computing system 302, which may include a standalone server or another type of computing device. The geolocation system 101 may perform one or more operations and/or processes described in more detail elsewhere herein.

Network 320 includes one or more wired and/or wireless networks. For example, network 320 may include a cellular network, a public land mobile network (PLMN), a local area network (LAN), a wide area network (WAN), a private network, the Internet, and/or the like, and/or a combination of these or other types of networks. The network 320 enables communication among the devices of environment 300.

User device 103 includes one or more devices capable of receiving, generating, storing, processing, and/or providing information associated with generating geolocation information, as described elsewhere herein. The user device 103 may include a communication device and/or a computing device. For example, the user device 103 may include a wireless communication device, a user equipment (UE), a mobile phone (e.g., a smart phone or a cell phone, among other examples), a laptop computer, a tablet computer, a handheld computer, a desktop computer, a gaming device, a wearable communication device (e.g., a smart wristwatch or a pair of smart eyeglasses, among other examples), an Internet of Things (IoT) device, or a similar type of device. The user device 103 may communicate with one or more other devices of environment 300, as described elsewhere herein.

The number and arrangement of devices and networks shown in FIG. 3 are provided as an example. In practice, there may be additional devices and/or networks, fewer devices and/or networks, different devices and/or networks, or differently arranged devices and/or networks than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of environment 300 may perform one or more functions described as being performed by another set of devices of environment 300.

Figure 4:
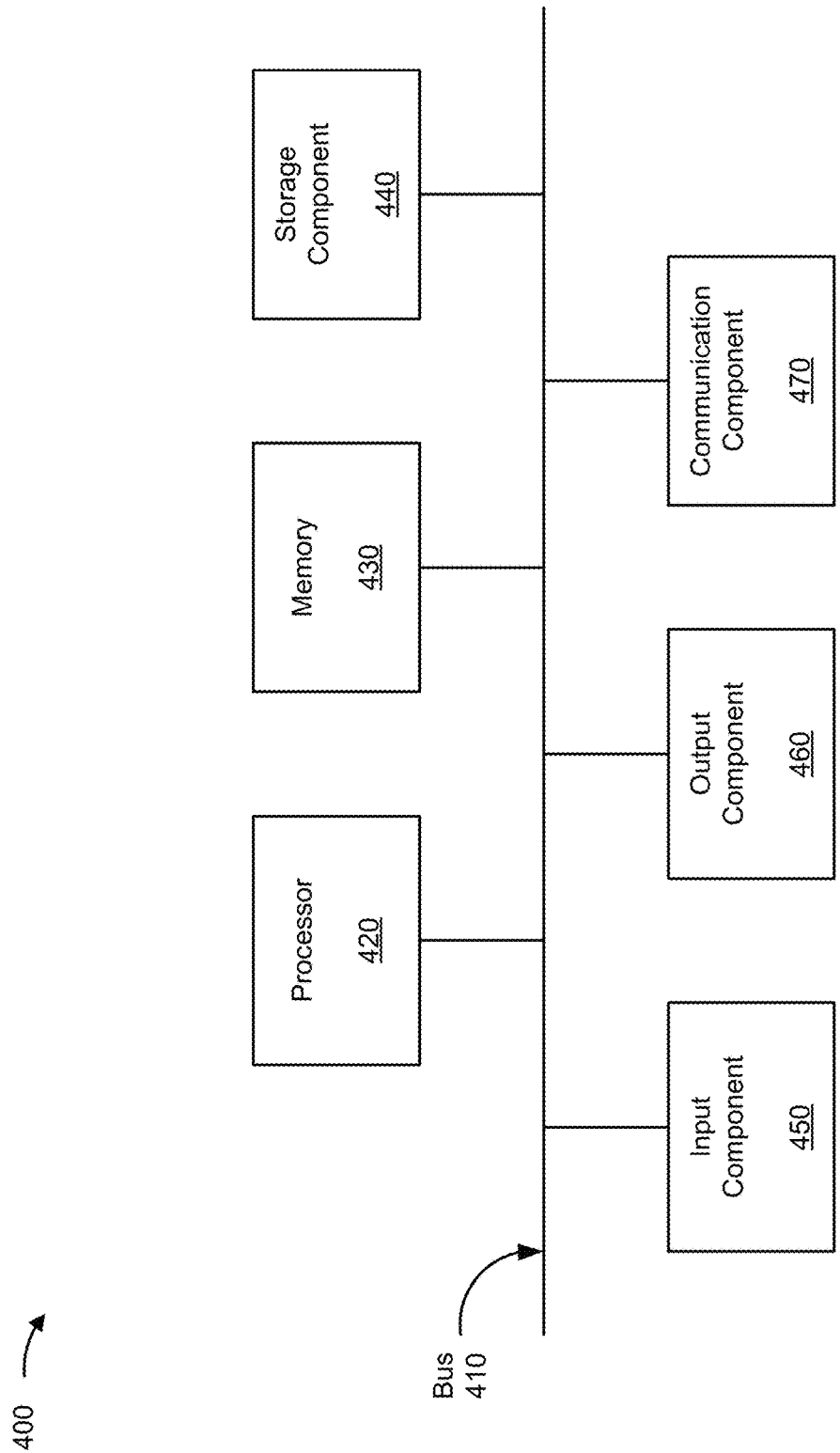
FIG. 4 is a diagram of example components of one or more devices of FIG. 3.

FIG. 4 is a diagram of example components of a device 400, which may correspond to the geolocation system 101 and/or the user device 103. In some implementations, the geolocation system 101 and/or the user device 103 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory), a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
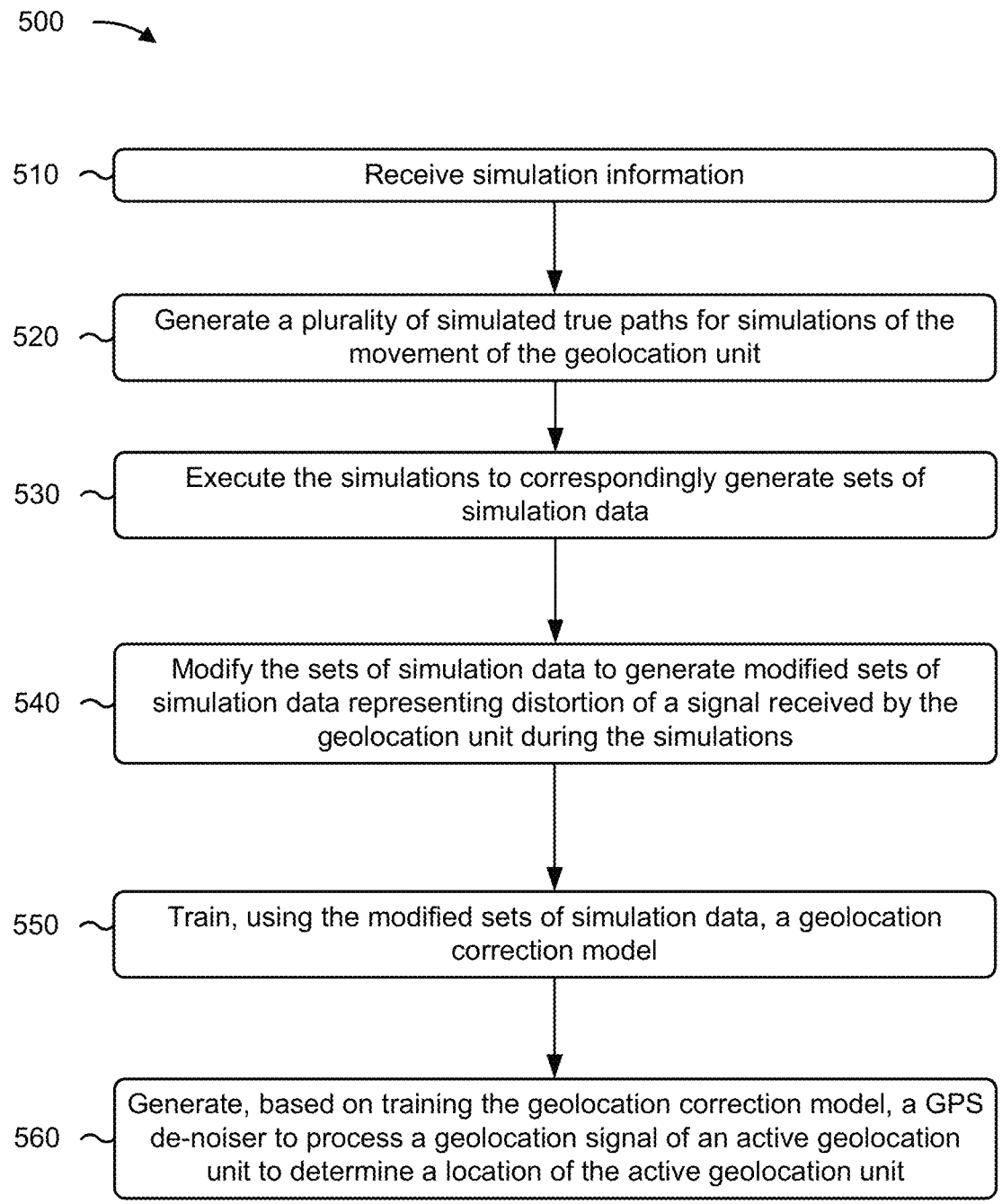
FIG. 5 is a flow chart of an example process relating to denoising GPS signals using simulated models.

FIG. 5 is a flowchart of an example process 500 associated with systems and methods for generating geolocation information. In some implementations, one or more process blocks of FIG. 5 may be performed by a device (e.g., geolocation system 101). In some implementations, one or more process blocks of FIG. 5 may be performed by another device or a group of devices separate from or including the device, such as a user device (e.g., user device 103) and/or the like. Additionally, or alternatively, one or more process blocks of FIG. 5 may be performed by one or more components of a device 400, such as processor 420, memory 430, storage component 440, input component 450, output component 460, communication component 470, and/or the like.

As shown in FIG. 5, process 500 may include receiving simulation information (block 510). For example, the device may receive simulation information associated with iteratively simulating movement of a geolocation unit, as described above. The simulation information may identify a type of the geolocation unit. The device may generate simulated true paths, associated with the true simulation locations, and time lengths of iterations of the simulation based on the type of the geolocation unit.

Alternatively, and/or additionally, the simulation information may identify a geographical area. The device may generate simulated true paths, associated with the true simulation locations, based on the geographical features of the geographical area. In some implementations, the simulation information may identify a desired level of accuracy associated with the geolocation correction model determining a true location of the active geolocation unit. The convergence threshold may be based on the desired level of accuracy.

In some implementations, the simulation information includes sets of true location data and corresponding simulated measured data of the plurality of executed simulations. The true location data may be associated with simulation paths of a plurality of executed simulations. The corresponding simulated measured data may be generated based on applying Gaussian noise to the simulation paths.

As further shown in FIG. 5, process 500 may include generating a plurality of simulated true paths for simulations of the movement of the geolocation unit (block 520). For example, the device may generate a plurality of simulated true paths for simulations of the movement of the geolocation unit, as described above.

As further shown in FIG. 5, process 500 may include executing the simulations to correspondingly generate sets of simulation data (block 530). For example, the device may execute the simulations to correspondingly generate sets of simulation data, as described above. The simulations may be executed based on simulation parameters that were configured based on at least one of a characteristic of the user device or a geographical region.

In some implementations, the device may configure a simulation engine to execute the simulations. Configuring the simulation engine may include configuring ranges for one or more simulation parameters of the set of simulation parameters based on the simulation information.

As further shown in FIG. 5, process 500 may include modifying the sets of simulation data to generated modified sets of simulation data representing distortion of a signal received by the geolocation unit during the simulations (block 540). For example, the device may modify the sets of simulation data to generate modified sets of simulation data representing distortion of a signal received by the geolocation unit during the simulations, as described above. In some implementations, the modified sets of simulation data correspond to simulated measured paths.

In some implementations, the device may apply a first level of Gaussian noise to a true simulation path of the simulation for a first time period of the simulation. The device may apply a second level of Gaussian noise to the true simulation path of the simulation for a second time period of the simulation. A maximum of a range of the first level of Gaussian noise may be less than or equal to a threshold percentage of a minimum of a range of the second level of Gaussian noise.

The first level of Gaussian noise may be applied to simulate distortion of a geolocation signal received by the geolocation unit during the simulation. The second level of Gaussian noise may be applied to simulate an anomaly in the geolocation signal. The device may determine a frequency of applying the second level of Gaussian noise, a distance of a simulation path corresponding to the movement of the geolocation unit, and/or a time length of the simulation based on a set of simulation parameters associated with the simulation.

In some implementations, the first time period may be associated with a first set of timestamps of the simulation and the second time period may be associated with a second set of timestamps of the simulation. A quantity of the first set of timestamps may be greater than or equal to a threshold percentage of a total quantity of timestamps associated with a combination of the first time period and the second time period. A quantity of the second set of timestamps may be less than the threshold percentage of the total quantity of timestamps.

As further shown in FIG. 5, process 500 may include training, using the modified sets of simulation data, a geolocation correction model (block 550). For example, the device may train, using the modified sets of simulation data, a geolocation correction model based on differences between true location data of the plurality of simulated true paths and simulated measured data of the simulated measured paths, as described above. The modified sets of simulation data may indicate the differences based on mapping, based on a simulated timing of an associated simulation, true simulation locations of the true location data to corresponding measured locations of the simulated measured data. The geolocation correction model may comprise a neural network that is associated with at least one or an autoencoder model or a long short-term memory model. The autoencoder model may iteratively configure the simulation parameters of the executed simulations. The long short-term model may iteratively identify dependencies associated with simulated measured data and true location data of the executed simulations. In some implementations, the geolocation correction model may be associated with a geolocation application installed on the user device.

As further shown in FIG. 5, process 500 may include generating, based on training the geolocation correction model, a GPS de-noiser to process a geolocation signal of an active geolocation unit to determine a location of the active geolocation unit (block 560). For example, the device may generate the GPS de-noiser to process a geolocation signal of an active geolocation unit to determine a location of the active geolocation unit based on the differences between the true location data and the simulated measured data, as described above.

In some implementations, generating the GPS de-noiser comprises enabling the GPS de-noiser to receive, from the active geolocation unit, measured geolocation data associated with the geolocation signal; processing, using the GPS de-noiser, the measured geolocation data to generate corrected geolocation data; perform a geolocation analysis of the active geolocation unit based on the corrected geolocation data, the geolocation analysis is relative to the active geolocation unit being within a threshold distance of a particular geographical location, and perform one or more actions associated with the active geolocation unit being within the threshold distance of the particular geographical location.

In some implementations, the one or more actions may include at least one of: providing, to a user device associated with the active geolocation unit, a notification that the user device is or was within the threshold distance of the particular geographical location; or causing an interface of a geolocation platform to indicate that the user device is or was within a threshold distance of the particular geographical location.

Alternatively, and/or additionally, the one or more actions may include at least one of indicating, via a display of the user device, a location corresponding to the corrected geolocation data or providing, to a geolocation platform, the corrected location to permit the geolocation platform to perform a geolocation analysis associated with the user device.

In some implementations, generating the GPS de-noiser includes at least one of deploying the GPS de-noiser to the active geolocation unit to permit the active geolocation unit to locally process the geolocation signal, or enabling the GPS de-noiser to receive, from the active geolocation unit, measured geolocation data associated with the geolocation signal and process the measured geolocation data to indicate the location of the active geolocation unit.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Certain user interfaces have been described herein and/or shown in the figures. A user interface may include a graphical user interface, a non-graphical user interface, a text-based user interface, and/or the like. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

To the extent the aforementioned implementations collect, store, or employ personal information of individuals, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various encryption and anonymization techniques for particularly sensitive information.

It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
    receiving, by a device, simulation information associated with iteratively simulating movement of a geolocation unit;
    generating, by the device, a plurality of simulated true paths for simulations of the movement of the geolocation unit;
    executing, by the device, the simulations to correspondingly generate sets of simulation data;
    modifying, by the device, the sets of simulation data to generate modified sets of simulation data representing distortion of a signal received by the geolocation unit during the simulations,
        wherein the modified sets of simulation data correspond to simulated measured paths;
    determining, by the device and based on map data included in the simulation information, that a simulated true path, of the plurality of simulated true paths, is associated with an occlusion of the signal received by the geolocation unit;
    time interleaving, by the device, interrupts into a modified set of simulation data, of the modified sets of simulation data, based on the simulated true path being associated with the occlusion of the signal received by the geolocation unit;
    training, by the device and using the modified sets of simulation data, a geolocation correction model based on differences between true location data of the plurality of simulated true paths and simulated measured data of the simulated measured paths; and
    generating, by the device and based on training the geolocation correction model, a global positioning system (GPS) de-noiser to process a geolocation signal of an active geolocation unit to determine a location of the active geolocation unit based on the differences,
        wherein generating the GPS de-noiser comprises performing a geolocation analysis of the active geolocation unit based on corrected geolocation data, and
        wherein the geolocation analysis is performed based on the active geolocation unit being within a threshold distance of a particular geographic location.

2. The method of claim 1, wherein modifying the sets of simulation data, for each simulation of the simulations, comprises:
    applying a first level of Gaussian noise to a true simulation path of the simulation for a first time period of the simulation; and
    applying a second level of Gaussian noise to the true simulation path of the simulation for a second time period of the simulation,
        wherein a maximum of a range of the first level of Gaussian noise is less than or equal to a threshold percentage of a minimum of a range of the second level of Gaussian noise.

3. The method of claim 2, wherein the first time period is associated with a first set of timestamps of the simulation and the second time period is associated with a second set of timestamps of the simulation, wherein a quantity of the first set of timestamps is greater than or equal to a threshold percentage of a total quantity of timestamps associated with a combination of the first time period and the second time period, and wherein a quantity of the second set of timestamps is less than the threshold percentage of the total quantity of timestamps.

4. The method of claim 1, wherein the modified sets of simulation data indicate the differences based on mapping, based on a simulated timing of an associated simulation, true simulation locations of the true location data to corresponding measured locations of the simulated measured data.

5. The method of claim 1, wherein modifying the sets of simulation data includes:
   utilizing a first filter to modify a first portion of the sets of simulation data; and
   utilizing a second filter to modify a second portion of the sets of simulation data,
      wherein the first filter is different from the second filter.

6. The method of claim 1, wherein generating the GPS de-noiser further comprises:
   enabling the GPS de-noiser to receive, from the active geolocation unit, measured geolocation data associated with the geolocation signal;
   processing, using the GPS de-noiser, the measured geolocation data to generate the corrected geolocation data; and
   performing one or more actions associated with the active geolocation unit being within the threshold distance of the particular geographical location.

7. The method of claim 6, wherein performing the one or more actions comprises at least one of:
   providing, to a user device associated with the active geolocation unit, a notification that the user device is or was within the threshold distance of the particular geographical location; or
   causing an interface of a geolocation platform to indicate that the user device is or was within the threshold distance of the particular geographical location.

8. A device, comprising:
   one or more processors configured to:
      receive simulation information associated with simulating movement of a geolocation unit;
      configure, based on the simulation information, a simulation engine to generate a simulation to simulate the movement of the geolocation unit;
      train a geolocation correction model associated with correcting a measured geographic location of the geolocation unit by iteratively:
         causing the simulation engine to execute an iteration of the simulation based on a set of simulation parameters to generate simulation data,
            wherein simulation parameters, of the set of simulation parameters, of the executed iteration are iteratively configured,
         sorting the simulation data into sets of simulation data that are associated with true simulation locations and corresponding measured simulation locations,
         modifying the sets of simulation data to generate training data,
            wherein the sets of simulation data are modified to represent noise included in a signal received by the geolocation unit,
         determining, based on map data included in the simulation parameters, that a true simulation location, of the true simulation locations, is associated with an occlusion of a signal received by the geolocation unit,
         time interleaving interrupts into a portion of the training data based on the true simulation location being associated with the occlusion of the signal received by the geolocation unit,
         training the geolocation correction model based on the training data,
         determining a model score associated with the geolocation correction model being trained based on the iteration, and
         unless the model score satisfies a convergence threshold, updating the simulation parameters for a subsequent iteration of training the geolocation correction model using a subsequent iteration;
      determine, after an iteration of training the geolocation correction model, that the model score satisfies the convergence threshold; and
      utilize the geolocation correction model to process a geolocation signal of an active geolocation unit to determine a location of the active geolocation unit.

9. The device of claim 8, wherein the simulation information identifies a geographical area,
   wherein simulated true paths, associated with the true simulation locations, are generated based on geographical features of the geographical area.

10. The device of claim 8, wherein the simulation information identifies a desired level of accuracy associated with the geolocation correction model determining a true location of the active geolocation unit,
    wherein the convergence threshold is based on the desired level of accuracy.

11. The device of claim 8, wherein configuring the simulation engine comprises:
    configuring ranges for one or more simulation parameters of the set of simulation parameters based on the simulation information.

12. The device of claim 8, wherein the set of simulation parameters comprises at least one of:
    a first level of Gaussian noise to be applied to simulate distortion of a geolocation signal received by the geolocation unit during the simulation;
    a second level of Gaussian noise to be applied to simulate an anomaly in the geolocation signal;
    a frequency of applying the second level of Gaussian noise to the geolocation signal;
    a distance of a simulation path corresponding to the movement of the geolocation unit; or
    a time length of the simulation.

13. The device of claim 8, wherein the one or more processors, when configuring the geolocation correction model, are configured to at least one of:
    deploy the geolocation correction model to the active geolocation unit to permit the active geolocation unit to locally process the geolocation signal; or
    enable the geolocation correction model to receive, from the active geolocation unit, measured geolocation data associated with the geolocation signal and process the measured geolocation data to indicate the location of the active geolocation unit.

14. The device of claim 8, wherein an autoencoder learns a representation for a modified set of simulation data, of the modified sets of simulation data, by training a neural network to ignore noise included in the modified set of simulation data.

15. A non-transitory computer-readable medium storing instructions, the instructions comprising:
one or more instructions that, when executed by one or more processors, cause the one or more processors to:
receive a geolocation signal associated with a user device;
determine, based on the geolocation signal, a measured location of the user device;
generate measured geolocation data that corresponds to the measured location;
process, using a geolocation correction model, the measured geolocation data to generate corrected geolocation data,
wherein the geolocation correction model is trained based on simulation data associated with a plurality of executed simulations of movement of a geolocation unit associated with the user device,
wherein the simulation data is generated based on a plurality of simulated true paths for simulations of the movement of a geolocation unit,
wherein a modified signal and information identifying a true location of the geolocation unit associated with the modified signal are provided as inputs to the geolocation correction model,
wherein a set of interrupts is interleaved into the modified signal based on the true location of the geolocation unit being associated with an occlusion of the geolocation signal received by the user device, and
wherein a neural network is used to process the inputs and generate the corrected geolocation data; and
perform an action associated with the corrected geolocation data and the user device.

16. The non-transitory computer-readable medium of claim 15, wherein the simulation data comprises sets of true location data and corresponding simulated measured data of the plurality of executed simulations,
wherein the true location data are associated with simulation paths of the plurality of executed simulations and the corresponding simulated measured data are generated based on applying Gaussian noise to the simulation paths.

17. The non-transitory computer-readable medium of claim 15, wherein the plurality of executed simulations were executed based on simulation parameters that were configured based on at least one of:
a characteristic of the user device, or
a geographical region that includes the measured location.

18. The non-transitory computer-readable medium of claim 15, wherein the geolocation correction model is associated with a geolocation application installed on the user device.

19. The non-transitory computer-readable medium of claim 15, wherein the geolocation correction model comprises a neural network that was trained based on:
an autoencoder model iteratively configuring simulation parameters of the plurality of executed simulations, or
a long short-term memory model iteratively identifying dependencies associated with simulated measured data and true location data of the plurality of executed simulations.

20. The non-transitory computer-readable medium of claim 15, wherein the one or more instructions, that cause the one or more processors to perform the action, cause the one or more processors to at least one of:
indicate, via a display of the user device, a location corresponding to the corrected geolocation data; or
provide, to a geolocation platform, the corrected geolocation data to permit the geolocation platform to perform a geolocation analysis associated with the user device.

* * * * *